(12) United States Patent
Yoo et al.

(10) Patent No.: US 10,551,434 B2
(45) Date of Patent: Feb. 4, 2020

(54) RECHARGEABLE POWER MODULE AND TEST SYSTEM INCLUDING THE SAME

(71) Applicant: Samsung Electronics Co., Ltd., Suwon-si, Gyeonggi-do (KR)

(72) Inventors: Jong-Woon Yoo, Gwangmyeong-si (KR); Ki-Jae Song, Goyang-si (KR); Soo-Yong Park, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 136 days.

(21) Appl. No.: 15/674,894

(22) Filed: Aug. 11, 2017

(65) Prior Publication Data

US 2017/0343605 A1    Nov. 30, 2017

Related U.S. Application Data

(62) Division of application No. 14/728,333, filed on Jun. 2, 2015, now Pat. No. 9,759,769.

(30) Foreign Application Priority Data

Nov. 11, 2014 (KR) ........................ 10-2014-0155962

(51) Int. Cl.
*G01R 31/317* (2006.01)
*H02J 7/00* (2006.01)
*G01R 31/28* (2006.01)
*G01R 31/319* (2006.01)

(52) U.S. Cl.
CPC ... *G01R 31/31721* (2013.01); *G01R 31/2834* (2013.01); *G01R 31/31924* (2013.01); *H02J 7/008* (2013.01); *H02J 7/0047* (2013.01); *H02J 2007/005* (2013.01)

(58) Field of Classification Search
None
See application file for complete search history.

(56) References Cited

U.S. PATENT DOCUMENTS

| 6,456,103 | B1 | 9/2002 | Eldridge et al. |
| 6,687,839 | B1 * | 2/2004 | Tate ........................ G06F 1/263 |
| | | | 713/324 |
| 6,929,879 | B2 | 8/2005 | Yamazaki |
| 7,307,433 | B2 | 12/2007 | Miller et al. |

(Continued)

FOREIGN PATENT DOCUMENTS

| KR | 2004098357 | 11/2004 |
| KR | 2010065683 | 6/2010 |

(Continued)

OTHER PUBLICATIONS

"Rechargeable Power Module and Test System Including the Same" Specification, Drawings, Claims and Prosecution History, of U.S. Appl. No. 14/728,333, filed Jun. 2, 2015, by Jong-Woon Yoo, et al.

*Primary Examiner* — Paresh Patel
(74) *Attorney, Agent, or Firm* — Onello & Mello, LLP

(57) ABSTRACT

A rechargeable power module (RPM) may include a rechargeable energy storage device such as a battery or capacitor, a charging circuit, a direct-current (DC) to DC converter, a low drop-out (LDO) voltage regulator and a controller. The charging circuit provides the rechargeable energy storage device with a charging current based on power requirements of device under test and the state of charge, or storage, of the energy storage device.

7 Claims, 13 Drawing Sheets

(56) References Cited

U.S. PATENT DOCUMENTS

| | | |
|---|---|---|
| 7,511,543 B2 | 3/2009 | Luo et al. |
| 7,580,807 B2 | 8/2009 | Bullock et al. |
| 7,961,546 B2 | 6/2011 | Mair et al. |
| 8,805,530 B2* | 8/2014 | John .................... A61N 1/3785 607/61 |
| 2003/0193318 A1 | 10/2003 | Ozawa et al. |
| 2004/0164708 A1* | 8/2004 | Veselic ................. H02J 7/0068 320/132 |
| 2006/0262579 A1 | 11/2006 | Chou |
| 2009/0180649 A1* | 7/2009 | Hsu ......................... H04R 1/10 381/311 |
| 2010/0219797 A1* | 9/2010 | Veselic ................. H02J 7/0068 320/162 |
| 2012/0239340 A1 | 9/2012 | Chen et al. |
| 2013/0289662 A1 | 10/2013 | Olson et al. |
| 2013/0342236 A1 | 12/2013 | Song et al. |
| 2014/0091825 A1 | 4/2014 | Chui |
| 2014/0145745 A1 | 5/2014 | Ryu et al. |
| 2014/0167248 A1 | 6/2014 | Delgado et al. |
| 2014/0212711 A1 | 7/2014 | Lee et al. |
| 2016/0064979 A1* | 3/2016 | Huang ................. H02J 7/0055 320/114 |

FOREIGN PATENT DOCUMENTS

| | | |
|---|---|---|
| KR | 1184681 | 5/2012 |
| KR | 1281823 | 7/2013 |

* cited by examiner

310
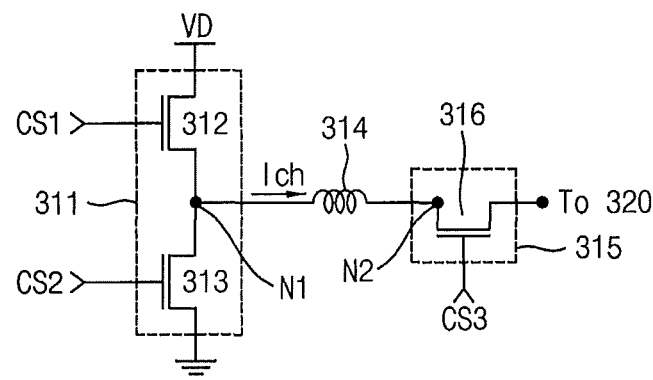
FIG. 8A
320
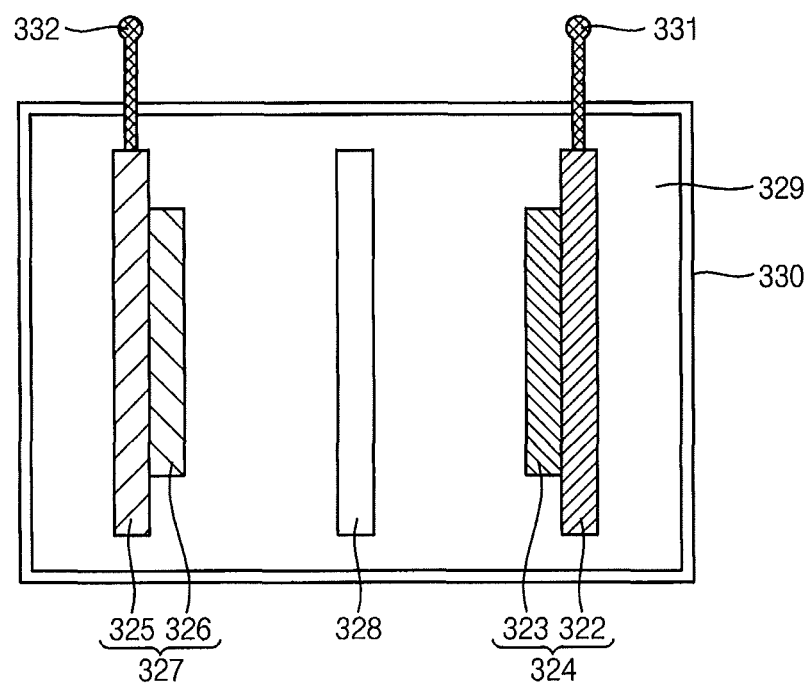

RECHARGEABLE POWER MODULE AND TEST SYSTEM INCLUDING THE SAME

CROSS-REFERENCE TO RELATED APPLICATION(S)

The new application is a divisional of U.S. application Ser. No. 14/728,333 filed on Jun. 2, 2015 which claims priority under 35 USC § 119 to Korean Patent Application No. 10-2014-0155962, filed on Nov. 11, 2014, in the Korean Intellectual Property Office (KIPO), the contents of which are incorporated herein in their entirety by reference.

BACKGROUND

1. Technical Field

Exemplary embodiments relate to testing semiconductor devices, and more particularly to rechargeable power modules and test systems including the same.

2. Discussion of the Related Art

A tester is an automated device for performing an electrical test of a semiconductor device. Generally, memory semiconductor devices such as dynamic random access memories (DRAMs) gradually increase in capacity and the number of pins.

When the capacity of the semiconductor memory device increases, the cost of the electrical test increases because the time required for performing the electrical test increases. In order to increase throughput, a semiconductor memory device tester generally adopts a parallel testing method, whereby a plurality of semiconductor devices are tested at one time, instead of testing the semiconductor devices one by one.

SUMMARY

In exemplary embodiments in accordance with principles of inventive concepts a rechargeable power module capable of adaptively configuring test environment, rechargeable power module capable of adaptively configuring test environment.

In exemplary embodiments in accordance with principles of inventive concepts a test system includes a rechargeable power module capable of adaptively configuring test environment.

In exemplary embodiments in accordance with principles of inventive concepts a rechargeable power module (RPM) includes a rechargeable energy storage device; a charging circuit configured to provide the rechargeable energy storage device with a charging current from a power resource, the power resource being provided to a first group of devices under test (DUT)s from an automated test equipment (ATE); a direct-current (DC) to DC converter configured to stabilize a first voltage from the rechargeable energy storage device to output a second voltage; a low drop-out (LDO) voltage regulator configured to regulate the second voltage to provide a regulated voltage to a second group of DUTs; and a controller configured to control the charging circuit and the LDO voltage regulator based on a test sequence information signal and a state of charge of the rechargeable battery, the test sequence information signal being associated with test sequence of the DUTs.

In exemplary embodiments in accordance with principles of inventive concepts a rechargeable power module (RPM) includes a charging circuit including a charging unit configured to provide the charging current from the power resource in response to a first control signal and a second control signal, the first and second control signal provided from the controller; an inductor that stores the charging current; and a switch connected between the inductor and the rechargeable energy storage device, the switch configured to selectively provide the rechargeable energy storage device with the charging current stored in the inductor in response to a third control signal from the controller, wherein the inductor is connected between the charging unit and the switch.

In exemplary embodiments in accordance with principles of inventive concepts a rechargeable power module (RPM) includes an LDO voltage regulator including a p-channel metal-oxide semiconductor (PMOS) transistor that has a source coupled to the second voltage; a voltage divider that includes a variable resistor and a first resistor, wherein the variable resistor and the first resistor are connected in series between a drain of the PMOS transistor and a ground voltage; and an operational amplifier that has a first input terminal, a second input terminal and an output terminal, wherein the first input terminal receives a reference voltage, the second input terminal is connected to a feedback node at which the variable resistor and the first resistor are connected to each other, the output terminal is connected to a gate of the PMOS transistor, and the regulated voltage is provided at the feedback node.

In exemplary embodiments in accordance with principles of inventive concepts a rechargeable power module (RPM) includes a controller configured to adjust a resistance of the variable resistor by applying a resistor control signal to the variable resistor.

In exemplary embodiments in accordance with principles of inventive concepts a rechargeable power module (RPM) includes a switching circuit coupled to the charging circuit, the switching circuit configured to selectively provide the power resource to the charging circuit, and wherein the controller is configured to apply a switching control signal to the switching circuit.

In exemplary embodiments in accordance with principles of inventive concepts a rechargeable power module (RPM) includes a rechargeable energy storage device including a lithium ion secondary battery, and the RPM is configured to charge, in the rechargeable energy storage device, a surplus power resource corresponding to the portion of the power resource not consumed by the first group of DUTs; and provide the charged surplus power resource to the second group of DUTs based on the test sequence information signal according to test items performed on the first group of DUTs.

In exemplary embodiments in accordance with principles of inventive concepts a rechargeable power module (RPM) is configured to charge DUTs wherein the first group of DUTs are same as the second group of DUTs.

In exemplary embodiments in accordance with principles of inventive concepts a rechargeable power module (RPM) is configured to charge DUTs wherein the first group of DUTs are different from the second group of DUTs.

In exemplary embodiments in accordance with principles of inventive concepts a test system includes automated test equipment (ATE) configured to provide test operation signals; a test board on which a plurality of devices under test (DUT)s are mounted, wherein the DUTs return output test result signals to the ATE in response to a test pattern signal of the test operation signals; and at least one rechargeable power module (RPM) configured to charge surplus power corresponding to a portion of a power resource of the test operation signals and configured to provide the charged surplus power resource to a second group of DUTs, the ATE providing the power resource to a first group of DUTs and the portion of the power resource not consumed by the first group of DUTs.

In exemplary embodiments in accordance with principles of inventive concepts a test system includes automated test equipment (ATE) wherein at least one RPM is disposed proximately to the test board and the at least one RPM is connected to the test board through a pogo pin.

In exemplary embodiments in accordance with principles of inventive concepts a test system includes automated test equipment (ATE) wherein at least one RPM includes a rechargeable energy storage device; a charging circuit configured to provide the rechargeable energy storage device with a charging current from the power resource; a direct current (DC) to DC converter configured to stabilize a first voltage from the rechargeable energy storage device to output a second voltage; a low drop-out (LDO) voltage regulator configured to regulate the second voltage to provide a regulated voltage to a second group of DUTs; and a controller configured to control the charging circuit and the LDO regulator based on a test sequence information signal and a state of charge of the rechargeable energy storage device.

In exemplary embodiments in accordance with principles of inventive concepts a test system includes automated test equipment (ATE) wherein the ATE provides a test sequence information signal to the at least one RPM, the sequence information signal associated with a test sequence on the DUTs.

In exemplary embodiments in accordance with principles of inventive concepts a test system includes automated test equipment (ATE) wherein the ATE performs test one the DUTs according to a test sequence based on power resource consumption of the DUTs.

In exemplary embodiments in accordance with principles of inventive concepts a test system includes automated test equipment (ATE) wherein the test sequence includes a DC test, a function test and an alternating current (AC) test which are performed on the DUTs.

In exemplary embodiments in accordance with principles of inventive concepts a test system includes automated test equipment (ATE) configured to wherein the ATE comprises a programmable power supply configured to provide the power resource to each of the DUTs, and the power resource includes a plurality of power supply voltages which are provided to a plurality of power pins of each DUT.

In exemplary embodiments in accordance with principles of inventive concepts, an electronic device test system energy storage device includes, an energy storage device; a controller to receive an indication of power required by one or more devices under test; the controller to receive an indication of the state of storage of the energy storage device; and the controller to direct energy to the energy storage device, dependent upon the indications of power required by a device under test and the state of storage of the energy storage device.

In exemplary embodiments in accordance with principles of inventive concepts, an electronic device test system energy storage device includes a lithium ion secondary battery and the controller directs charge to the battery when the battery's state of charge is below a threshold level and power available from a source other than the energy storage device is sufficient to supply power to the one or more devices under test, as indicated by the indication of power required by the one or more devices under test.

In exemplary embodiments in accordance with principles of inventive concepts an electronic device test system includes an electronic device test system energy storage device that includes, an energy storage device; a controller to receive an indication of power required by one or more devices under test; the controller to receive an indication of the state of storage of the energy storage device; and the controller to direct energy to the energy storage device, dependent upon the indications of power required by a device under test and the state of storage of the energy storage device and the electronic device test system energy storage device includes a lithium ion secondary battery and the controller directs charge to the battery when the battery's state of charge is below a threshold level and power available from a source other than the energy storage device is sufficient to supply power to the one or more devices under test, as indicated by the indication of power required by the one or more devices under test, and automated test equipment configured to provide test operations signals, to receive output test result signals, and to be the source the source of power other than the energy storage device.

In exemplary embodiments in accordance with principles of inventive concepts an electronic device test system includes an electronic device test system energy storage device and automated test equipment configured to supply power to one group of devices under test and the electronic storage device is configured to supply power to another group of devices under test.

In exemplary embodiments in accordance with principles of inventive concepts an electronic device test system includes an electronic device test system energy storage device and automated test equipment configured to supply power to one group of devices under test and the electronic storage device is configured to supply power to another group of devices under test, wherein the automated test equipment is configured to supply power to one group of devices under test and the electronic storage device is configured to supply power to another group of devices under test when the power requirements of the devices under test exceeds the power supply capacity of the automated test equipment and a test sequence signal is indicative of the power requirements of the devices under test.

BRIEF DESCRIPTION OF THE DRAWINGS

Illustrative, non-limiting exemplary embodiments will be more clearly understood from the following detailed description taken in conjunction with the accompanying drawings.

FIG. 7 illustrates the charging circuit in the RPM of FIG. 6 according to exemplary embodiments.

FIG. 8A illustrates a structure of the rechargeable battery in FIG. 6.

DETAILED DESCRIPTION OF THE EMBODIMENTS

Figure 1:
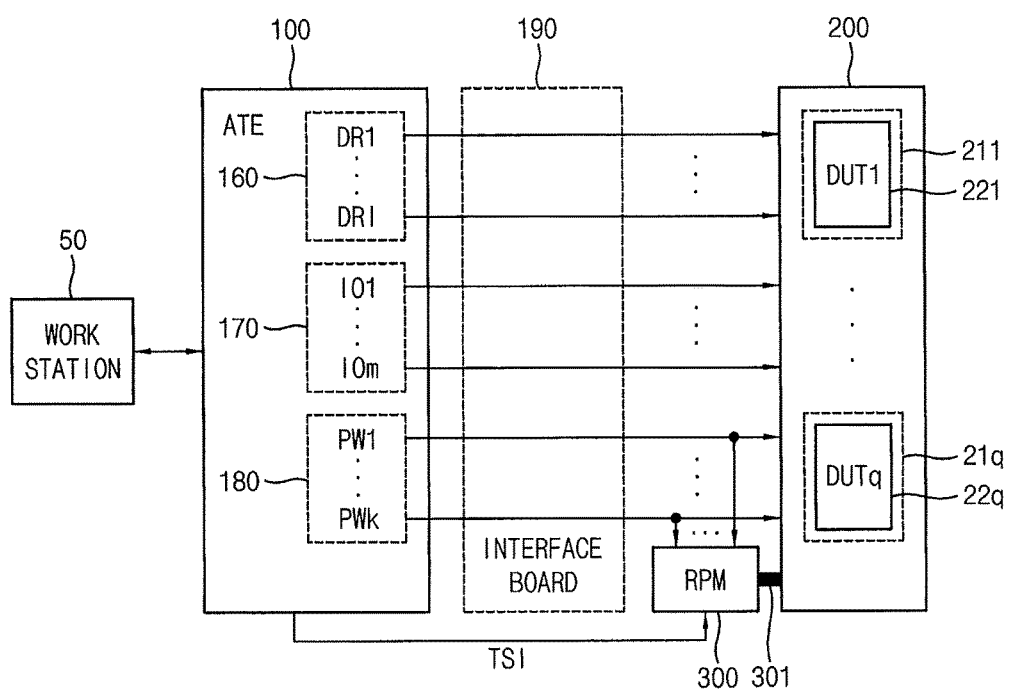
FIG. 1 is a block diagram illustrating a test system according to exemplary embodiments.

Various exemplary embodiments will be described more fully hereinafter with reference to the accompanying drawings, in which some exemplary embodiments are shown. Inventive concepts may, however, be embodied in many different forms and should not be construed as limited to the exemplary embodiments set forth herein. These exemplary embodiments are just that—examples—and many implementations and variations are possible that do not require the details provided herein. It should also be emphasized that the present disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the scope of inventive concepts. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In exemplary embodiments in accordance with principles of inventive concepts, an electronic device test system includes an energy storage device and a controller. The controller is configured to receive an indication of power required by one or more devices under test and to receive an indication of the state of storage of the energy storage device. Depending upon the indications of power requirement and state of charge of the energy storage device, the controller may direct charge to the energy storage device. In exemplary embodiments in accordance with principles of inventive concepts, the energy storage device may be a capacitor or lithium ion secondary batter, for example, and the storage device may provide some indication of its state of charge and the controller may direct charge to it only when the state of charge is below some threshold value.

Automated test equipment may operate with the energy storage device and provide to it indicia of power requirements of one or more devices under test as they relate to the amount of power available from the automated test equipment (for example, a deficiency or surplus of available power). These indicia may be related to a test sequence, and may correlate to power required in each of a sequence of test steps, for example. The controller may employ these indicia, along with the energy storage device's state of charge indicia to direct charge to a battery when the battery's state of charge is below a threshold level and power available from the automated test equipment is sufficient to supply power to one or more devices under test. The controller may also employ these indicia to control the supply of power from the automated test equipment to one group of devices under test and from the energy storage device to another group of devices under test.

FIG. 1 is a block diagram illustrating a test system according to exemplary embodiments of inventive concepts.

Referring to FIG. 1, a test system 10 includes an automated test equipment (ATE) 100, a test board 200 and a rechargeable power module (RPM) 300. In some embodiments, the test system 10 may further include an interface board 190 interposed between the ATE 100 and the test board 200. The interface board 190 may route electrical interconnection between the ATE 100 and the test board 200, for example. The interface board 190 may connect the ATE 100 and the test board 200 by one or more cables.

The test system 10 may further include a workstation 50 coupled to the ATE 100. The workstation 50 may control overall operation of a series of test operations, such as function test, and implement timing calibration and an interface with a user. The ATE 100 may perform respective test operations on devices under test (DUTs) 221~22q by executing test program from the workstation 50.

The test board 200 may include a plurality of sockets 211~21q (where q is an integer greater than two) and each of the DUTs 221~22q may be mounted on each of the sockets 211~21q.

The ATE 100 generates test operation signals for testing the DUTs 221~22q. The DUTs 221~22q receive the test operation signals and operate based on the test operation signals.

For example, when manufacturing a semiconductor device, such as a logic or memory device, electrical parameters of the semiconductor device may be measured by the ATE 100 to perform a pass/fail test of the manufactured semiconductor device. The ATE 100 may generate the test operation signals for performing a pass/fail test of the manufactured semiconductor device such as DUTs 221~22q. The DUTs 221~22q may perform a predetermined operation in response to the test operation signals received through the pins. In some embodiments, the DUTs 221~22q may generate test result signals as a result of the predetermined operation. The ATE 100 may receive the test result signals and may determine whether the DUTs 221~22q pass or fail a given test based on the test result signals.

The ATE 100 may include driver channels 160 (DR1~DRl, where l is an integer greater than one) for transferring the generated test operation signals, input/output (I/O) channels 170 (IO1~IOm, where 1 is an integer greater than one) and power channels 180 (PW1~PWk, where k is an integer greater than one). In some embodiments, the driver channels 160 provide command signals, address signals and a clock signal. The driver channels 160 may provide the command signals, the address signals and the clock signal commonly to the DUTs 221~22q. In some embodiments, the I/O channels 170 provide test pattern signals to the DUTs 221~22q respectively. In some embodiments, the power channels 180 provide a power resource such as voltage or current to the DUTs 221~22q respectively.

The RPM 300 may be disposed proximately to the test board 200 and may be connected to the test board 200 through a pogo pin 301. The RPM 300 may charge a surplus power resource corresponding to a portion of a power resource that is provided to the DUTS 221~22q, respectively, through the power channels 180 of the ATE 100. The surplus portion of the power resource is not consumed by the DUTs 221~22q. The RPM 300 may discharge power while charging power and the RPM 300 may provide charged power resource to the DUTs 221~22q or other DUTs on the test board 200 in response to a test sequence information signal TSI from the ATE 100 according to a test item. Since the RPM 300 is disposed proximately to the test board 200, the RPM 300 may enhance power integrity by avoiding degradation that might otherwise occur due to delay when the RPM 300 provides a power resource to the test board 200.

When the ATE 100 performs parallel test on the DUTs 221~22q, the number of simultaneously-tested DUTs 221~22q depends on the power resource that the ATE 100 is capable of providing. When the ATE 100 performs parallel test on the DUTs 221~22q, the ATE 100 applies voltage or current to the power pins of each of the DUTs 221~22q. However, the magnitude of the applied voltage or current has a limit. In addition, at times the DUTs 221~22q consume only a portion of the applied power resource of the ATE 100.

In exemplary embodiments in accordance with principles of inventive concepts, when the parallel test are performed on the DUTs 221~22q, the RPM 300 may store this "surplus" power from the ATE 100, for example, by charging a surplus power resource, which may be included within RPM 300, for example. The stored power may then be provided to the DUTs 221~22q or other DUTs as required.

The RPM 300 may provide the charged power resource to the DUTs 221~22q when the test item requires a power resource exceeding an affordable power resource that the power channel 180 provides, for example. In such exemplary embodiments, because the DUTs 221~22q receive power from the RPM 300, which is disposed proximately to the test board 200, the RPM 300 power integrity may be enhanced by avoiding any delays in supply.

In addition, the RPM 300 may provide the charged power resource (also referred to herein as, stored power) to other DUTs instead of the DUTs 221~22q when the test item requires a power resource less than an affordable power resource that the power channel 180 may provide. In such exemplary embodiments, the number of DUTs that are simultaneously parallel-tested increases, the test cost may decrease.

Tests that the ATE 100 performs on the DUTs 221~22q may include a plurality of test items such as: DC test, AC test and function test, and power consumed by each of the DUTs 221~22q may be different according to the test items. In addition, the power resource that the ATE 100 provides to the DUTs 221~22q may include a plurality of powers (at different voltages, for example), and the DUTs 221~22q consumes only a portion of the applied power resource, instead of consuming the applied power resource up to 100% for each test item. Therefore, a surplus power resource may occur, which is not consumed by the DUTs 221~22q. That is, surplus power may be available, and RPM 300 may store the surplus power by charging a rechargeable battery, which may be included in the RPM 300, and may provide charged power resource to the DUTs 221~22q or other DUTs on the test board 200. In this manner, in accordance with principles of inventive concepts, the RPM 300 may increase the number of DUTs that are simultaneously parallel-tested and may enhance power integrity. In exemplary embodiments the RPM 300 is connectable to a conventional test system without altering the conventional test system, allowing for significant reduction in test costs.

Figure 2:
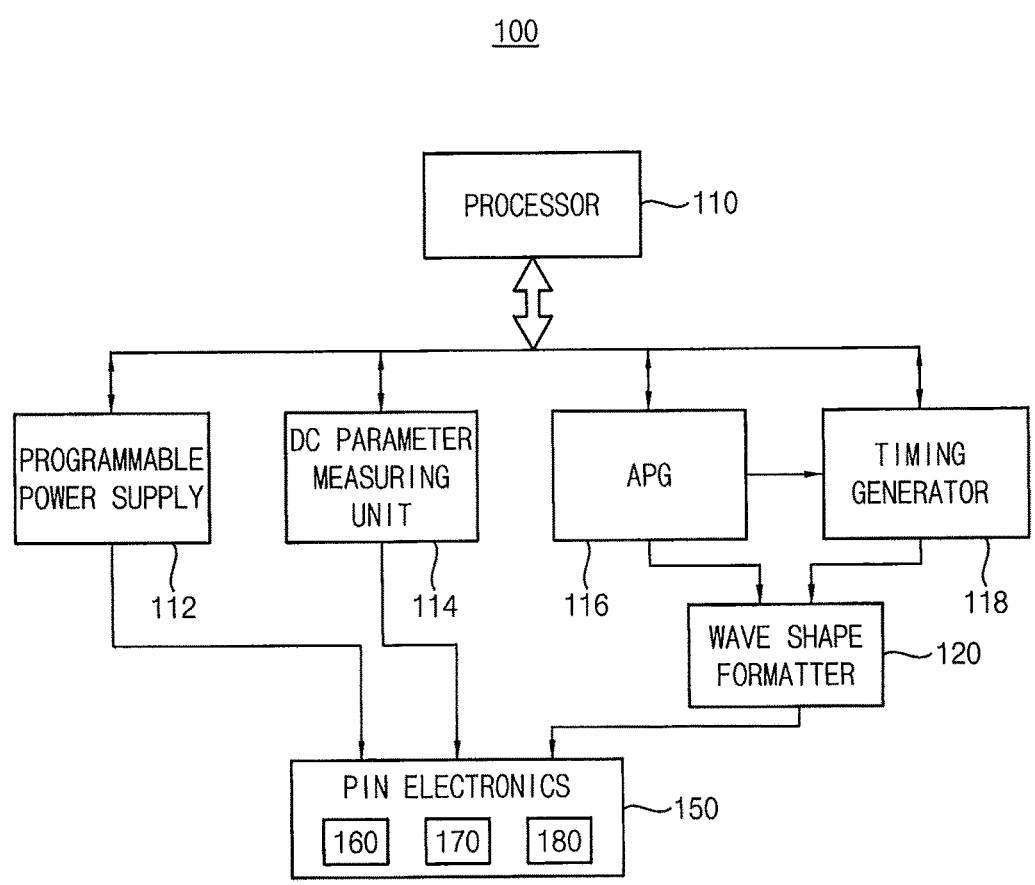
FIG. 2 is a block diagram illustrating the automated test equipment (ATE) in FIG. 1 according to exemplary embodiments.

FIG. 2 is a block diagram illustrating the automated test equipment (ATE) in FIG. 1 according to exemplary embodiments.

Referring to FIG. 2, the ATE 100 includes a processor 110 for controlling hardware components of the ATE 100. In exemplary embodiments, the hardware components include a programmable power supply 112, a DC parameter measurement unit 114, an algorithmic pattern generator 116, a timing generator 118, a wave shape formatter 120, pin electronics 150, and the like. The pin electronics 150 includes the driver channels 160, the I/O channels 170 and the power channels 180. In the ATE 100, a test program running on the processor 110 communicates signals and electrically tests functions of the DUT 221~22q connected via the pin electronics 150.

A test program for testing the DUT 500 may include a DC test, an AC test, and a function test, for example. The function test may operate to check the functionality of a semiconductor memory device, for example a DRAM, under its actual operational condition. That is, in some test program configurations an input pattern from the algorithmic pattern generator 116 of the ATE 100 is written to the DUT 221~22q, for example, the DRAM (write operation), and a returned output pattern from the DRAM is read out (read operation) and compared by the ATE 100 to an expected return pattern by a comparator (compare operation) to ensure proper functioning of the DRAM.

The DC test may be employed to test leakage current of the DUTs 221~22q. In the leakage test, the currents are measured on every pin of the DUTs 221~22q after applying voltages to the pins, or the voltages are measured after applying the currents. The leakage test is for checking stability of power supply wiring for the connecting path, checking required current, and measuring the leaked current in the DUT and in the tester, for example.

The AC test may be employed to check timing of the DUTs 221~22q. The timing test is for checking pulses of an output terminal after applying pulses to an input terminal of the DUTs 221~22q to check the input/output propagation delay time, for example. If there is an element which may cause propagation delay in hardware within the DUTs 221~22q, the element can be identified by the timing test and, in particular, unexpected delays and their associated elements may be identified.

Figure 3:
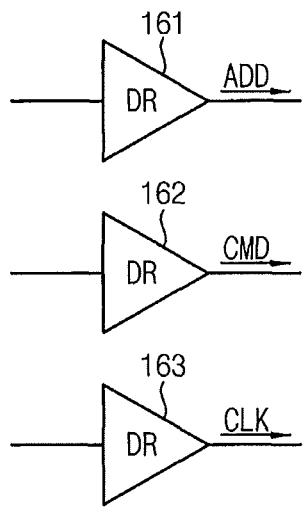
FIG. 3 illustrates an exemplary of the driver channels in FIG. 2 according to exemplary embodiments.

FIG. 3 illustrates an exemplary embodiment of the driver channels in FIG. 2 in accordance with principles of inventive concepts.

Referring to FIG. 3, the driver channels 160 may include a plurality of drivers 161, 162 and 163. The driver 161 provides the address signal ADD, the driver 162 provides the command signal CMD and the driver 163 provides the clock signal CLK. In this exemplary embodiment, the driver channels 160 are uni-directional channels for providing the address signal ADD, the command signal CMD and the clock signal CLK to the corresponding pins of the DUTs 221~22q. Other control signals for controlling the functionality of the DUTs 221~22q can likewise be generated by the ATE 100 and output to the DUTs 221~22q via the driver channels 160.

Figure 4:
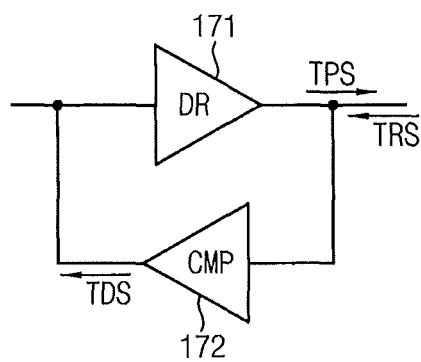
FIG. 4 illustrates an example of the I/O channels in FIG. 2 according to exemplary embodiments.

FIG. 4 illustrates an exemplary embodiment of the I/O channels in FIG. 2 in accordance with principles of inventive concepts.

Referring to FIG. 4, the I/O channels 170 may include a driver 171 and a comparator 172. The driver 171 may provide the data I/O pins 510 of the DUTs 221~22q with a test pattern signal TPS provided from the algorithmic pattern generator 116 and the wave shape formatter 120, for example. The comparator 172 receives the test result signal TRS from the DUTs 221~22q, compares the test result signal TRS with the test pattern signal TPS and outputs test determining signal TDS having a logic level according to a result of the comparison (indicative, for example, of whether a tested device has passed or failed). For example, the comparator 172 may output the test determining signal TDS having a first logic level (i.e., logic high level) when the test result signal TRS matches with the expected test pattern signal TPS. For example, the comparator 172 may output the test determining signal TDS having a second logic level (i.e., logic low level) when the test result signal TRS does not match with the expected test pattern signal TPS. Therefore, the ATE 100 may determine whether the DUTs 221~22q pass or fail based on the test determining signal TDS.

Figure 5:
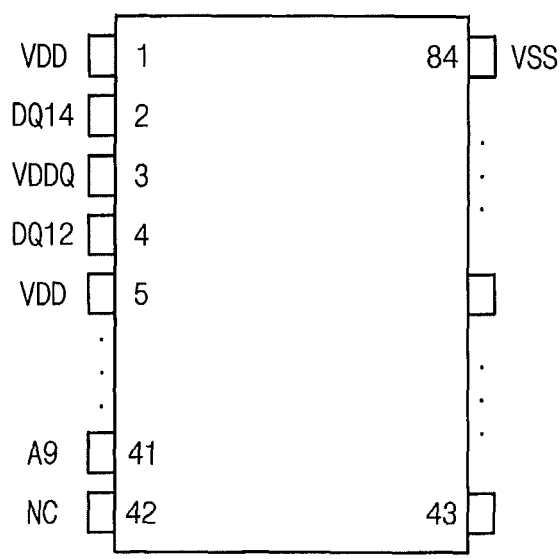
FIG. 5 illustrates a pin configuration of one of the devices under test (DUTs) in FIG. 1 according to exemplary embodiments.

FIG. 5 illustrates an exemplary pin configuration of one of DUTs in FIG. 1 in accordance with principles of inventive concepts.

Referring to FIG. 5, in this exemplary embodiment DUT 551 is a semiconductor device having 84 pins. The plurality of pins may include power supply voltage pins VDD, data pins DQ, address pins A, ground voltage pins VSS and non-connection pins NC, for example. The ATE 100 may provide a plurality of powers to each of the power supply voltage pins VDD when the test is performed.

Figure 6:
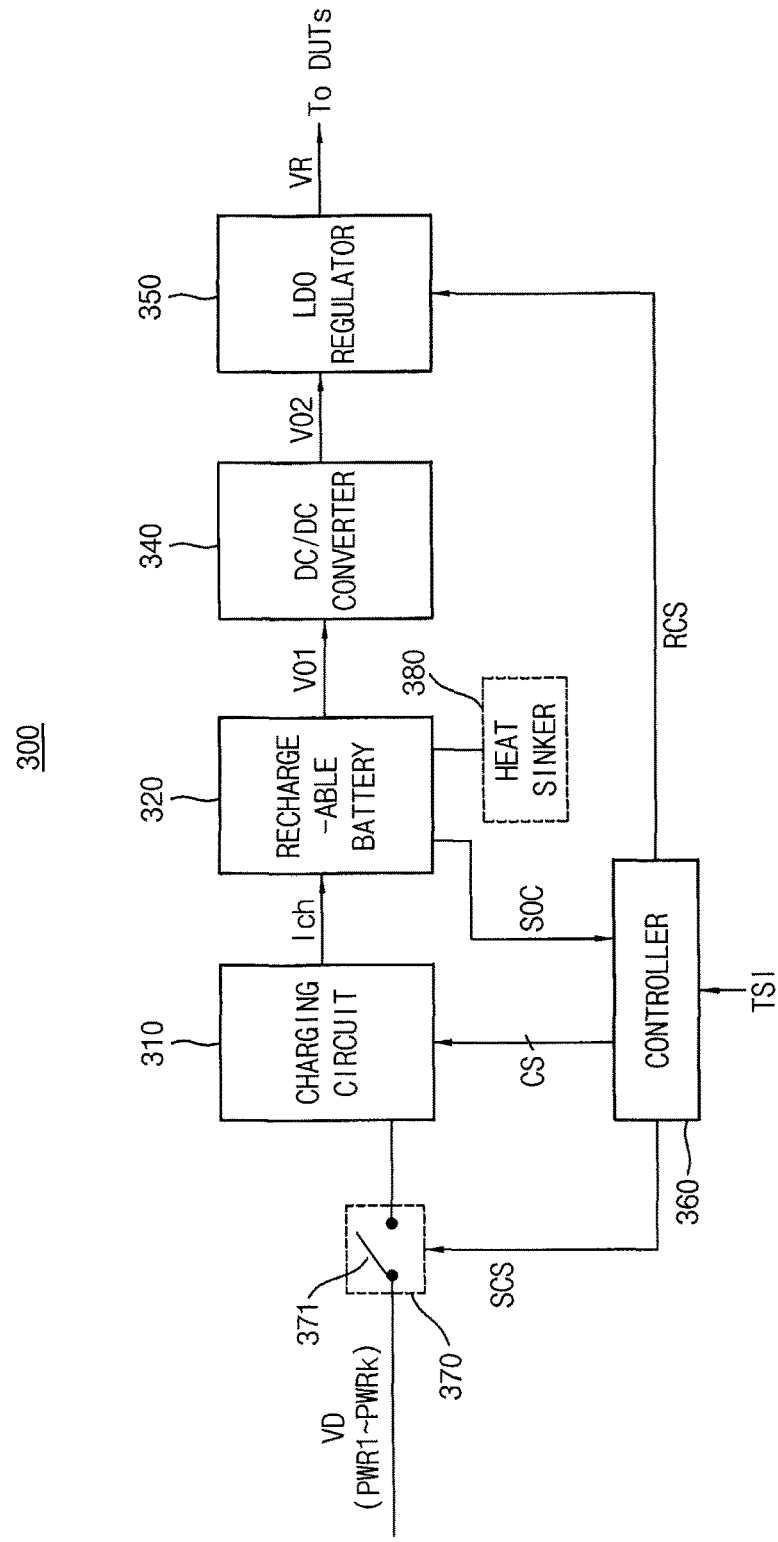
FIG. 6 is a block diagram illustrating a rechargeable power module (RPM) in the test system 10 of FIG. 1 according to exemplary embodiments.

FIG. 6 is a block diagram illustrating an exemplary embodiment of a rechargeable power module (RPM) in the test system 10 of FIG. 1 in accordance with principles of inventive concepts.

Referring to FIG. 6, the RPM 300 may include a charging circuit 310, a rechargeable storage device, such as a capacitor or battery 320, for example, a DC-to-DC converter 340, a low drop-out (LDO) voltage regulator 350 and a controller 360. In exemplary embodiments, the RPM 300 may further include a switching circuit 370 and a heat sink 380. The switching circuit 370 may be connected to the charging circuit 310 and the heat sink 380 may drain heat that may be generated in the rechargeable battery 310 outside the RPM 300.

The charging circuit 310 may provide the rechargeable battery 320 with a charging current Ich based on power resources PWR1~PWRk, i.e., direct voltage (where k is an integer greater than one) that are provided to the DUTs 221~22q from the ATE 100. The DC to DC converter 340 stabilizes a first voltage VO1 from the rechargeable battery 320 to output a second voltage VO2. The LDO voltage regulator 350 may regulate the second voltage VO2 to output a regulated voltage VR to the DUTs 221~22q or other DUTs mounted on the test board 200, for example.

In exemplary embodiments in accordance with principles of inventive concepts, controller 360 may control the charging circuit 310 and the LDO voltage regulator 350 based on a test sequence information signal TSI on the DUTs 221~22q and the state of charge SOC of the rechargeable battery 320. For controlling the charging circuit 310 and the LDO voltage regulator 350, the controller 360 provides control signals CS to the charging circuit 310 and a resistor control signal RCS to the LDO voltage regulator 350. In addition, the controller 360 may provide a switching control signal SCS to a switch in the switching circuit 370. The switching circuit 370 may selectively provide the power resources PWR1~PWRk, i.e., the direct voltage VD to the charging circuit 310 according to the test sequence or a power requirement in the DUTs by be connected to or disconnected from the charging circuit in response to the switching control signal SCS.

In exemplary embodiments controller 360 may adjust the amount of the charging current Ich provided to the rechargeable battery 320 by providing the control signals CS to the charging circuit 310. In addition, the controller 360 may adjust the level of the regulated voltage VR by providing the resistor control signal RCS to the LDO voltage regulator 350.

In exemplary embodiments in accordance with principles of inventive concepts RPM 300 may be a power module having a constant charging/discharging configuration that is capable of charging surplus power while providing the power resources to the DUTs 221~22q.

FIG. 7 illustrates an exemplary embodiment of charging circuit in the RPM of FIG. 6 in accordance with principles of inventive concepts.

Referring to FIG. 7, the charging circuit 310 may include a charging current providing unit 311, an inductor 314 and a switch 315.

In exemplary embodiments charging current providing unit 311 includes n-channel metal-oxide semiconductor (NMOS) transistors 312 and 313 connected in series between the DC voltage VD and a ground voltage. The NMOS transistor 312 has a drain coupled to the DC voltage VD, a source coupled to a node N1 and a gate receiving a first control signal CS1. The NMOS transistor 313 has a drain coupled to the node N1, a source coupled to the ground voltage and a gate receiving a second control signal CS2. The inductor 314 is coupled between nodes N1 and N2 and the inductor 314 may store the charging current Ich provided from the node N1. The switch 315 includes an NMOS transistor 316 coupled between the node N2 and the rechargeable battery 320 and the NMOS transistor 316 is turned on or off in response to a third control signal CS3 to selectively provide the charging current Ich to a rechargeable storage element, for example battery 320.

The NMOS transistor 312 adjusts an amount of current flowing to the node N1 from the DC voltage VD in response to the first control signal CS1, and the NMOS transistor 313 adjusts an amount of current sinking to the ground voltage from the node N1 in response to the second control signal CS2. In this manner, in accordance with principles of inventive concepts, the charging current providing unit 311 adjusts the level of the charging current Ich provided to the node N1 in response to the first and second control signals CS1 and CS2.

The NMOS transistor 316 is turned on/off in response to the third control signal CS3 thereby to selectively provide the charging current Ich to the rechargeable battery 320. When the rechargeable battery 320 is fully charged, the NMOS transistor 316 is turned off in response to the third control signal CS3, in accordance with principles of inventive concepts.

FIG. 8A illustrates a structure of an exemplary embodiment of the rechargeable battery in FIG. 6 in accordance with principles of inventive concepts.

Referring to FIG. 8A, in the rechargeable battery 320, which may be a lithium ion secondary battery, for example, a positive electrode 324, a negative electrode 327, and a separator 328 are provided in a housing 330 which isolates the components from the outside, and the housing 330 is filled with an electrolyte 329. Separator 328 is provided between the positive electrode 324 and the negative electrode 327.

In the positive electrode 324, a positive electrode active material layer 323 is provided in contact with a positive electrode current collector 322. In this exemplary embodiment, the positive electrode active material layer 323 and the positive electrode current collector 322 provided with the positive electrode active material layer 323 are collectively referred to as the positive electrode 324.

A negative electrode active material layer 326 is provided in contact with a negative electrode current collector 325. In this exemplary embodiment, the negative electrode active material layer 326 and the negative electrode current collector 325 provided with the negative electrode active material layer 406 are collectively referred to as the negative electrode 327.

The positive electrode current collector 322 and the negative electrode current collector 325 are connected to terminal portion 331 and terminal portion 332, respectively. Charge and discharge are performed through the terminal portion 331 and the terminal portion 332.

Although, in the illustrated structure, there are gaps between the positive electrode active material layer 233 and the separator 328 and between the negative electrode active material layer 326 and the separator 328, exemplary embodiments are not limited to this structure. The positive electrode active material layer 32 may be in contact with the separator 328 and the negative electrode active material layer 32 may be in contact with the separator 328, for example. Additionally, the rechargeable battery 320 (e.g., a lithium ion secondary battery) may be rolled into a cylinder with the separator 328 provided between the positive electrode 324 and the negative electrode 327, for example.

The positive electrode current collector 322 may be formed using a highly conductive material, such as a metal typified by stainless steel, gold, platinum, zinc, iron, copper, aluminum, or titanium, or an alloy thereof. Alternatively, the positive electrode current collector 322 may be formed using an aluminum alloy, to which an element that improves heat resistance, such as silicon, titanium, neodymium, scandium, or molybdenum, is added. Further alternatively, the positive electrode current collector 322 may be formed using a metal element that forms silicide by reacting with silicon. Examples of the metal element that forms silicide by reacting with silicon include zirconium, titanium, hafnium, vanadium, niobium, tantalum, chromium, molybdenum, tungsten, cobalt, nickel, and the like. The positive electrode current collector 322 may have a foil-like shape, a plate-like shape (a sheet-like shape), a net-like shape, a punching-metal shape, an expanded-metal shape, or the like, for example. In some exemplary embodiments, aluminum foil is used as the positive electrode current collector 322.

In some exemplary embodiments, lithium iron phosphate ($LiFePO_4$) having an olivine structure is used as a positive electrode active material included in the positive electrode active material layer 323.

In lithium iron phosphate having an olivine structure, the diffusion path of lithium ions is uni-dimensional. Thus, as crystallinity is high, the diffusion path of lithium ions is ensured, and insertion and extraction of a large amount of lithium ions is possible. Additionally, because lithium iron phosphate includes iron, the capacitance is large. In addition, iron phosphate ($FePO_4$), which is obtained by completely extracting lithium from lithium iron phosphate, is also stable; as a result, in accordance with principles of inventive concepts, the capacity of a lithium ion secondary battery formed using lithium iron phosphate can be increased safely.

Note that an active material refers to a material that relates to intercalation and deintercalation of ions that function as carriers. When an electrode (a positive electrode, a negative electrode, or both of them) is formed, an active material layer in which an active material is mixed with a conductive additive, a binding agent, a solvent and the like, is formed over a current collector. In this manner, the active material and the active material layer are distinguished. Accordingly, the positive electrode active material and the positive electrode active material layer 323 are distinguished, and a negative electrode active material to be described later and the negative electrode active material layer 406 are distinguished.

The positive electrode active material layer 323 may include a known conductive additive or binding agent (also referred to as a binder). In some exemplary embodiments, acetylene black (AB) is used as a conductive additive and polyvinylidene fluoride (PVDF) is used as a binding agent.

The negative electrode current collector 325 may be formed using a highly conductive material such as metal, for example. As the highly conductive material, stainless steel, iron, aluminum, copper, nickel, or titanium can be used, for example. The negative electrode current collector 325 can have a foil-like shape, a plate-like shape (a sheet-like shape), a net-like shape, a punching-metal (or punched-metal) shape, an expanded-metal shape, or the like, for example. In some exemplary embodiments, copper foil may be used as the negative electrode current collector 325.

In exemplary embodiments negative electrode active material layer 326 includes a negative electrode active material which can occlude and release ions serving as carriers. In some exemplary embodiments, spherical graphite may be used as the negative electrode active material included in the negative electrode active material layer 326.

A passivating film, formed by reduction and decomposition of ethylene carbonate (EC) serving as a solvent (to be described later) of the electrolyte 329, may be formed on a surface of graphite used as the negative electrode active material. With the passivating film, the solvent is prevented from further being decomposed and intercalation of lithium ions into the graphite, which is the negative electrode active material, is possible.

The negative electrode active material layer 326 may include a conductive additive or binding agent. In some exemplary embodiments, acetylene black (AB) is used as a conductive additive and polyvinylidene fluoride (PVDF) is used as a binding agent.

The negative electrode active material layer 326 may be pre-doped with lithium, for example. Pre-doping with lithium may be performed in such a manner that a lithium layer is formed on a surface of the negative electrode active material layer 326 by sputtering. Alternatively, lithium foil may be provided on the surface of the negative electrode active material layer 326, whereby the negative electrode active material layer 406 can be pre-doped with lithium.

The electrolyte 329 includes a solute and a solvent. As the solute of the electrolyte 329, a material including carrier ions is used. In some exemplary embodiments, the solute may include lithium salts such as $LiPF_6$, $LiClO_4$, $LiAsF_6$, $LiBF_4$, and $Li(C_2F_5SO_2)_2N$. In some exemplary embodiments, $LiPF_6$ is used as the solute.

As the solvent of the electrolyte 329, a material in which carrier ions can transfer is used. As the solvent of the electrolyte, an aprotic organic solvent may be used. In some exemplary embodiments, a mixed solution of ethylene carbonate (EC) and diethyl carbonate (DEC) may be used. As described above, ethylene carbonate is reduced and decomposed, and a passivating film is formed on a surface of the graphite, which is the negative electrode active material; therefore, ethylene carbonate is suitable for the solvent of the electrolyte 329. However, because ethylene carbonate is in a solid state at room temperature, a solution in which ethylene carbonate is dissolved in diethyl carbonate is used as the solvent.

An insulating porous material may be used as the separator 328. For example, paper; nonwoven fabric; a glass fiber; ceramics; a synthetic fiber containing nylon (polyamide), vinylon (polyvinyl alcohol based fiber), polyester, acrylic, polyolefin, or polyurethane; or the like may be used. In exemplary embodiments a material which is not dissolved in the electrolyte 329 may be selected.

Figure 8B:
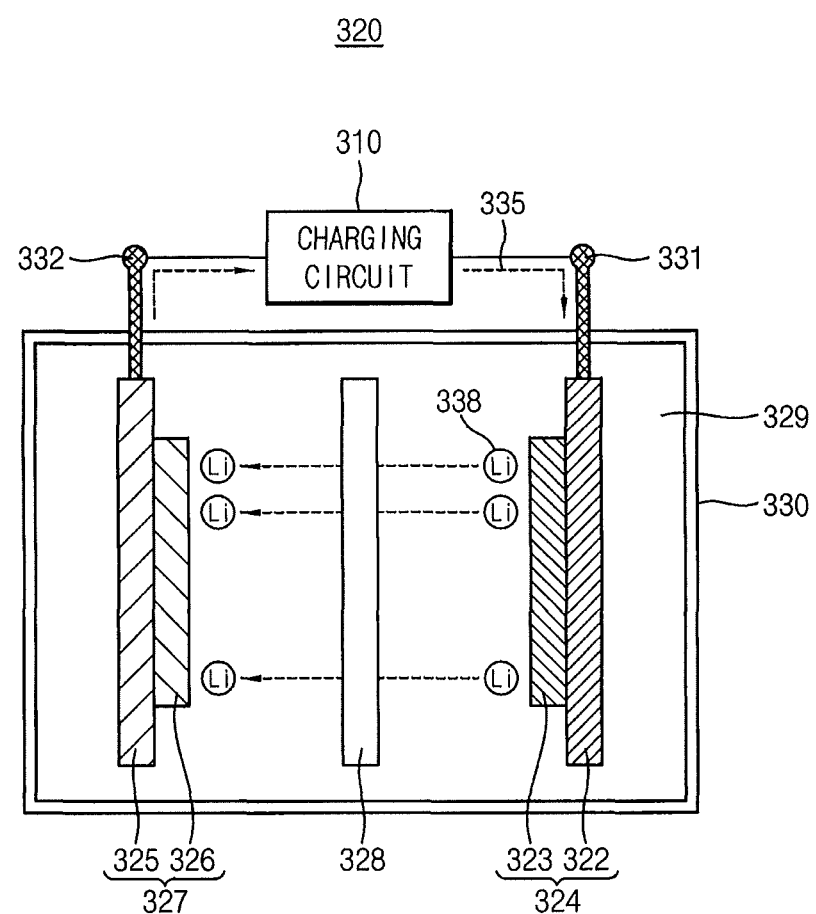
FIG. 8B illustrates that the rechargeable battery of FIG. 8A is charging.

FIG. 8B illustrates a process in which the rechargeable battery of FIG. 8A is charging.

Figure 8C:
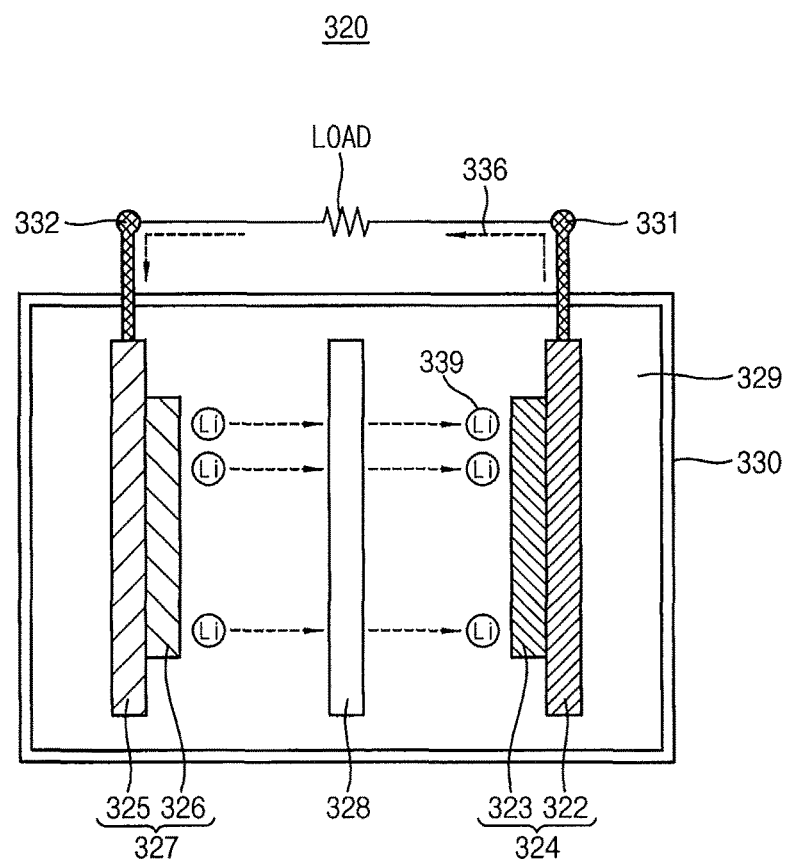
FIG. 8C illustrates that the rechargeable battery of FIG. 8A is discharging.

FIG. 8C illustrates a process in which the rechargeable battery of FIG. 8A is discharging.

In FIGS. 8B and 8C, the rechargeable battery 320 of FIG. 8A is implemented by a lithium ion secondary battery.

Referring to FIG. 8B, for charging the rechargeable battery 320, the charging circuit 310 is connected between the terminal portions 331 and 332 to provide the charging current Ich to the positive electrode 321, as a reference numeral 335 indicates. When the charging current Ich is provided to the positive electrode 324, lithium ions 338 are transferred to the negative electrode 327 through the separator 328. Therefore, the rechargeable battery 320 may be charged. When the level of the charging current Ich is excessive, a lithium plating phenomenon, in which lithium ions are accumulated on an interface between the negative electrode 327 and the electrolyte 329, may occur when a first amount of lithium ions transferred to the negative electrode 327 from the positive electrode 324 is greater than a second amount of lithium ions diffused at the negative electrode 327.

Referring to FIG. 8C, when the rechargeable battery 320 is discharging, a load LOAD is connected between the terminal portions 331 and 332, and a current is provided to the negative electrode 327 from the rechargeable battery 320, as a reference numeral 336 indicates. When the current is provided to the negative electrode 327 through the terminal portion 332, lithium ions 339 are transferred to the positive electrode 324 through the separator 328 from the negative electrode 327.

Figure 9:
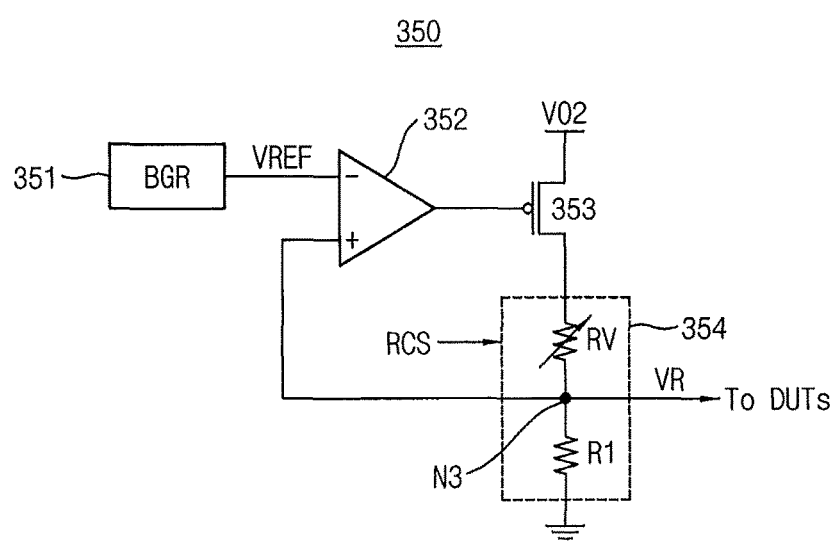
FIG. 9 is a circuit diagram illustrating the LDO voltage regulator in FIG. 6 according to exemplary embodiments.

FIG. 9 is a circuit diagram illustrating an exemplary embodiment of an LDO voltage regulator in FIG. 6 in accordance with principles of inventive concepts.

Referring to FIG. 9, the LDO voltage regulator 350 may include a reference voltage generator 351, an operational amplifier 352, a p-channel metal oxide semiconductor (PMOS) transistor 353 and a voltage divider 354. The voltage divider 354 may include a variable resistor RV and a first resistor R1 connected in series between the PMOS transistor 353 and the ground voltage. A node N3 where the variable resistor RV and the first resistor R1 are connected to each other may be referred to as a feedback node.

The reference voltage generator 351 may generate a reference voltage VREF.

The operational amplifier 352 has a second (or negative) input terminal receiving the reference voltage VREF, a first (or positive) input terminal connected to the feedback node N3 and an output terminal connected to a gate of the PMOS transistor 353. The second voltage VO2 is provided to a source of the PMOS transistor 353. The regulated voltage VR is provided at the feedback node N3 of the voltage divider 354.

The PMOS transistor 353 converts a level of the second voltage VO2 to output a converted voltage at the drain by a channel being formed between the source and the drain inversely proportional to the output of the operational amplifier 352. When the level of the regulated voltage VR increases, an output level of the operational amplifier 352 increases accordingly. Therefore, the amount of current flowing through the channel of the PMOS transistor 353 decreases and the level of the regulated voltage VR decreases. When the level of the regulated voltage VR decreases, the output level of the operational amplifier 352 decreases accordingly. Therefore, the amount of current flowing through the channel of the PMOS transistor 353 increases, the level of the regulated voltage VR increases. Therefore, at the feedback node N3, the regulated voltage VR following the second voltage is provided. The regulated voltage VR may be provided to the DUTs on the test board 200. The controller 360 in FIG. 6 may adjust the level of the regulated voltage VR by applying the resistor control signal RCS to the variable resistor VR to change a resistance of the variable resistor VR.

Figure 10:
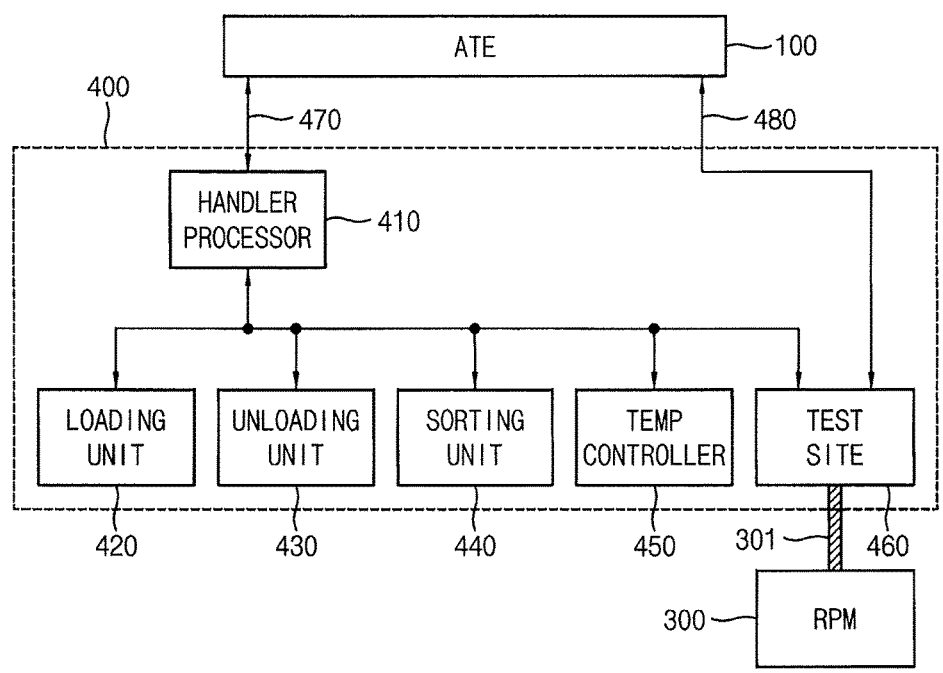
FIG. 10 is a block diagram illustrating another example of a test system according to exemplary embodiments.

FIG. 10 is a block diagram illustrating another exemplary embodiment of a test system in accordance with principles of inventive concepts.

Referring to FIG. 10, a test system includes an ATE 100, a handler 400 and a RPM 300.

The handler 400 may include a handler processor 410, a loading unit 420, an unloading unit 430, a sorting unit 440, a test site temperature controller 450 and a test site 460, for example. The handler 400 is an automated testing robot independently controlled by the handler processor 410 that communicates with a processor in the ATE 100.

The loading unit 420 may load the DUTs from the outside and move the DUTs to the test site 460 therein. The unloading unit 430 may convey the tested DUTs to the outside. The sorting unit 440 may receive the electrical test results from the ATE 100 through an information signal cable 470 to discriminate whether the DUT is acceptable or not.

The test site temperature controller 450 may control a temperature of an area where the DUTs are tested. For example, the test site 460 may be at high temperature, a room temperature, or a low temperature, to test whether the semiconductor device performs correctly regardless of the changes in the temperature. The test site 460 is an area electrically connecting the DUTs with the ATE 100 through the test board 200 in FIG. 1, and is connected to the ATE 100 via a test signal cable 480. The RPM 300 may be coupled to the test site 460 through the pogo pin 301, for example. As described above, the RPM 300 may charge, or store, surplus power therein, which is not consumed by the DUTs on the test site 460 when the ATE 100 provides the power resource the DUTs on the test site 460 and may provide the charged power resource, the stored power, to the DUTs on the test site 460.

In exemplary embodiments, the handler 400 loads the DUTs from outside and is connected to the ATE 100 via the information signal cable 470 and the test signal cable 480. The handler 400 carries the DUTs on sockets of the test board existing on the test site 460, and after that, transmits a test start signal to the ATE 100. When the handler 400 receives a test ending signal from the ATE 100, the handler 400 discriminates the DUTs on the sockets and unloads the DUTs according to the test result, for example, "passed" or "failed," received with the test ending signal.

Figure 11:
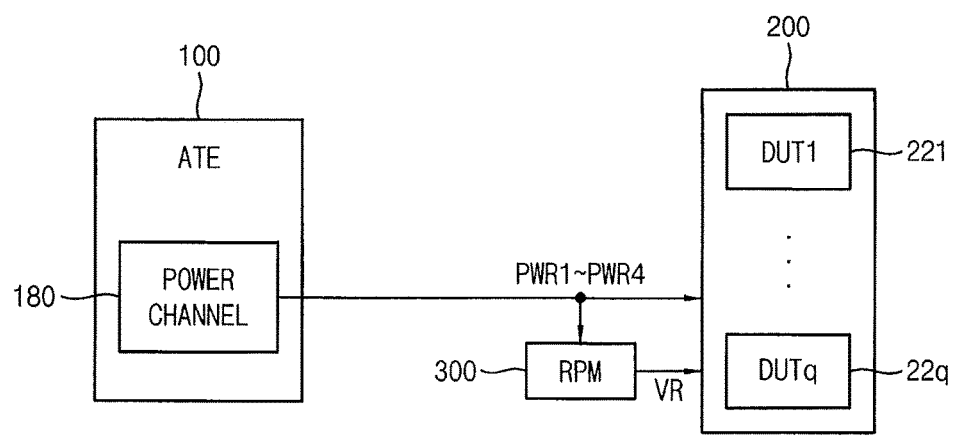
FIGS. 11 and 12 respectively illustrate that the ATE and the RPM provide the power resource to the test board in the test system of FIG. 1.
Figure 12:
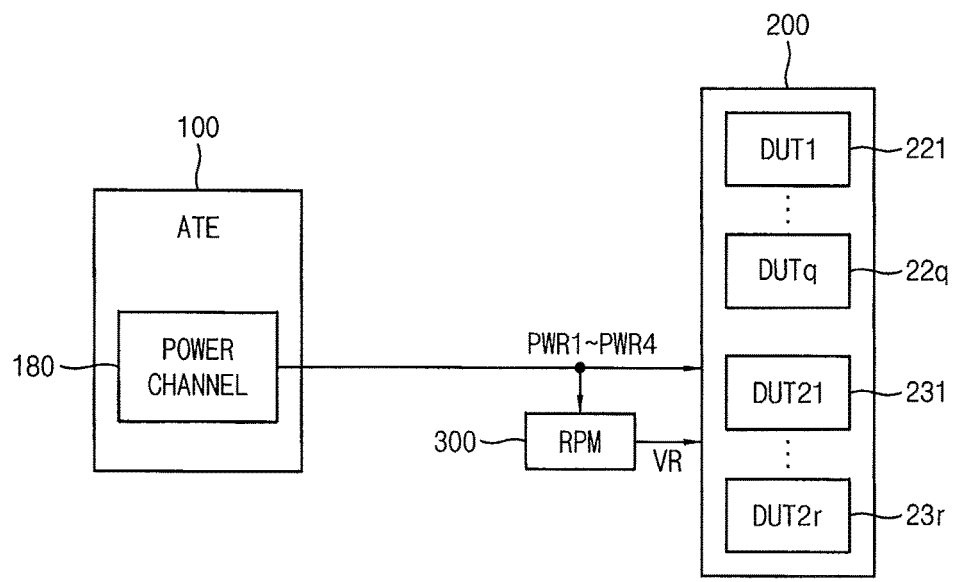

FIGS. 11 and 12 respectively illustrate that, in exemplary embodiments in accordance with principles of inventive concepts, the ATE and the RPM provide the power resource to the test board in the test system of FIG. 1.

Referring to FIG. 11, the power channel 180 of the ATE 100 provides the power resource PWR1~PWR4 to each of the DUTs 221~22$q$, the RPM 300 stores surplus power corresponding to a portion of the power resource PWR1~PWR4 provided to the DUTs 221~22$q$ that is not consumed by the DUTs 221~22$q$, and "re-provides" the regulated voltage VR to the DUTs 221~22$q$. In exemplary embodiments, with the DUTs that receive the power resource PWR1~PWR4 referred to as a first group of DUTS and the DUTs that receive the regulated voltage VR referred to as a second group of DUTS, the first group of DUTs are the same as the second group of DUTs in FIG. 11. The exemplary embodiment of FIG. 11 is a case in which the test item requires a power resource exceeding affordable power resource that the power channel 180 provides. That is, in exemplary embodiments in accordance with principles of inventive concepts, RPM 300 may store power when demand is low and the stored power may be employed to supplement power supplied by ATE 100, allowing power channel 180 within ATE 100 to be of reduced capacity and, thereby, less expensive than systems that don't employ a rechargeable power module in accordance with principles of inventive concepts. In exemplary embodiments, because the DUTs 221~22$q$ receive power from the RPM 300 that is disposed proximately to the test board 200, the RPM 300 may enhance power integrity that could otherwise be degraded due to delay.

In the exemplary embodiment of FIG. 12, the power channel 180 of the ATE 100 provides the power resource PWR1~PWR4 to each of the DUTs 221~22$q$, the RPM 300 charges, that is, stores, the surplus power corresponding to a portion of the power resource PWR1~PWR4 provided to the DUTs 221~22$q$ that is not consumed by the DUTs 221~22$q$, and provides the regulated voltage VR to other DUTs 231~23$r$ (r is an integer greater than one). With the DUTs that receive the power resource PWR1~PWR4 referred to as a first group of DUTS and the DUTs that receive the regulated voltage VR referred to as a second group of DUTS, the first group of DUTs are different from the second group of DUTs in FIG. 12. The exemplary embodiment of FIG. 12 is one in which the test item requires a power resource less than affordable power resource that the power channel 180 provides. That is, the capacity of power channel 180 is greater than required by the test item and, because the number of the DUTs that are simultaneously parallel-tested increases, test costs may be reduced.

Figure 13:
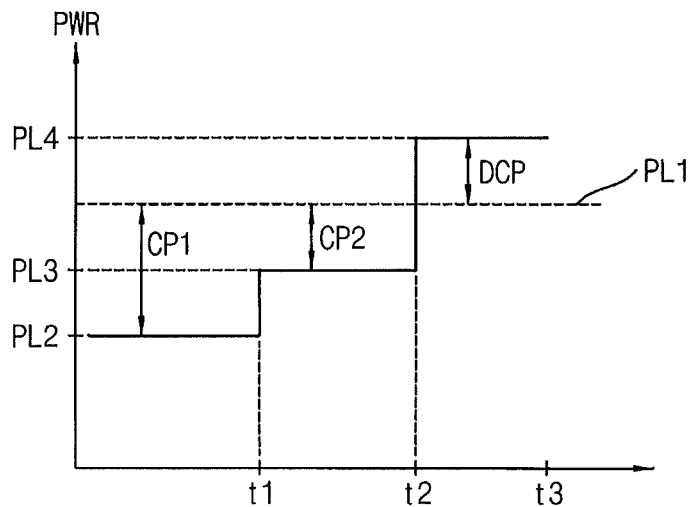
FIG. 13 illustrates an operation of the test system of FIG. 1 according to exemplary embodiments.

FIG. 13 illustrates operation of the test system of FIG. 1 according to exemplary embodiments.

In FIG. 13, a power level PL1 denotes a level of the power resource that is provided to each of the power pins of each DUT from the power channel 180 in FIG. 1, a power level PL2 denotes a level of the power resource that is consumed by each DUT during a first test interval, a power level PL3 denotes a level of the power resource that is consumed by each DUT during a second test interval, and a power level PL4 denotes a level of the power resource that is consumed by each DUT during a third test interval.

Referring to FIGS. 1 and 13, in exemplary embodiments in accordance with principles of inventive concepts, the RPM 300 may store surplus power, or charge a surplus power resource CP1, therein during the first test interval between times t0 and t1 when a first test item is tested on the DUTs. The RPM 300 may provide some of the surplus power resource CP1 to other DUTs. The RPM 300 may charge a surplus power resource CP2 therein during the second test interval, between times t1 and t2, when a second test item is tested on the DUTs. The RPM 300 may provide some of the surplus power resource CP2 to other DUTs. During the third test interval, between times t2 and t3, when a third test item is tested on the DUTs, the DUTs 221~229 requires more power than the power channel 180 of the ATE 100 can provide, and, in accordance with principles of inventive concepts, the RPM 300 may provide the DUTs 221~22$q$ with an excessive portion DCP. That is, in accordance with principles of inventive concepts, RPM 300 may supply supplemental power in the amount of DCP from power it has stored in order to meet the requirements of the DUTs in the third interval without requiring a greater power supply capability of the ATE 100.

Figure 14:
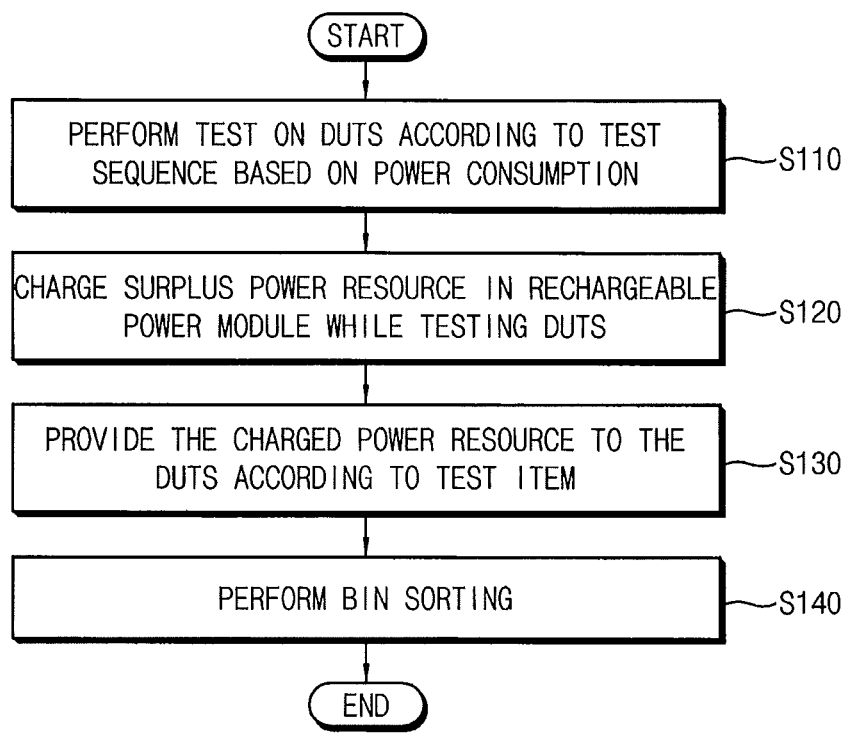
FIG. 14 is a flow chart illustrating a method of testing semiconductor devices according to exemplary embodiments.

FIG. 14 is a flow chart illustrating an exemplary method of testing semiconductor devices in accordance with principles of inventive concepts.

Referring to FIGS. 1, 6 and 14, in a method of testing semiconductor devices, a test is performed on the DUTs 221~22$q$ according to a test sequence based on power consumption (S110). A surplus power resource, power not consumed by the DUTs 221~22$q$, may be charged in a RPM 300 while the test is being performed on the DUTs 221~22$q$ (S120). The charged power resource, that is, the stored power, may be provided to the DUTs according to the test item (S130). Bin sorting may be performed to determine whether each of the DUTS 221~22q passes or fails (S140).

Figure 15:
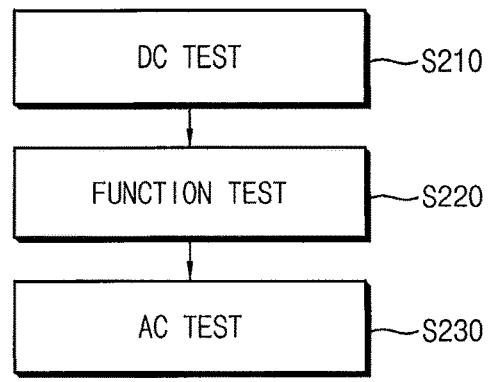
FIG. 15 illustrates test items performed on the DUTs in FIG. 14.

FIG. 15 illustrates exemplary test items performed on the DUTs in FIG. 14 in accordance with principles of inventive concepts.

Referring to FIG. 15, the test items may include a DC test (S210), a function test (S220) and an AC test (S230), for example. The DC test (S210) is for testing leakage current of the DUTs 221~22q. The function test (S220) commonly operates to check the functionality of a semiconductor memory device, for example a DRAM, under its actual operational condition. The AC test (S230) is for checking timing of the DUTs 221~22q.

As previously described, the power consumed by each of the DUTs 221~22q may be different according to the test items. In addition, the power resource that the ATE 100 provides to the DUTs 221~22q may include a plurality of powers, and the DUTs 221~22q may consume only a portion of the applied power resource rather than consuming the applied power resource up to 100% for each test item. Therefore, surplus power, which is not consumed by the DUTs 221~22q, may be available. The RPM 300 may store the surplus power resource, for example, in a rechargeable battery therein and may provide the stored power, the charged power resource, to the DUTs 221~22q or other DUTs on the test board 200. In exemplary embodiments, the RPM 300 may increase the number of DUTs that are simultaneously parallel-tested and enhance power integrity.

Figure 16:
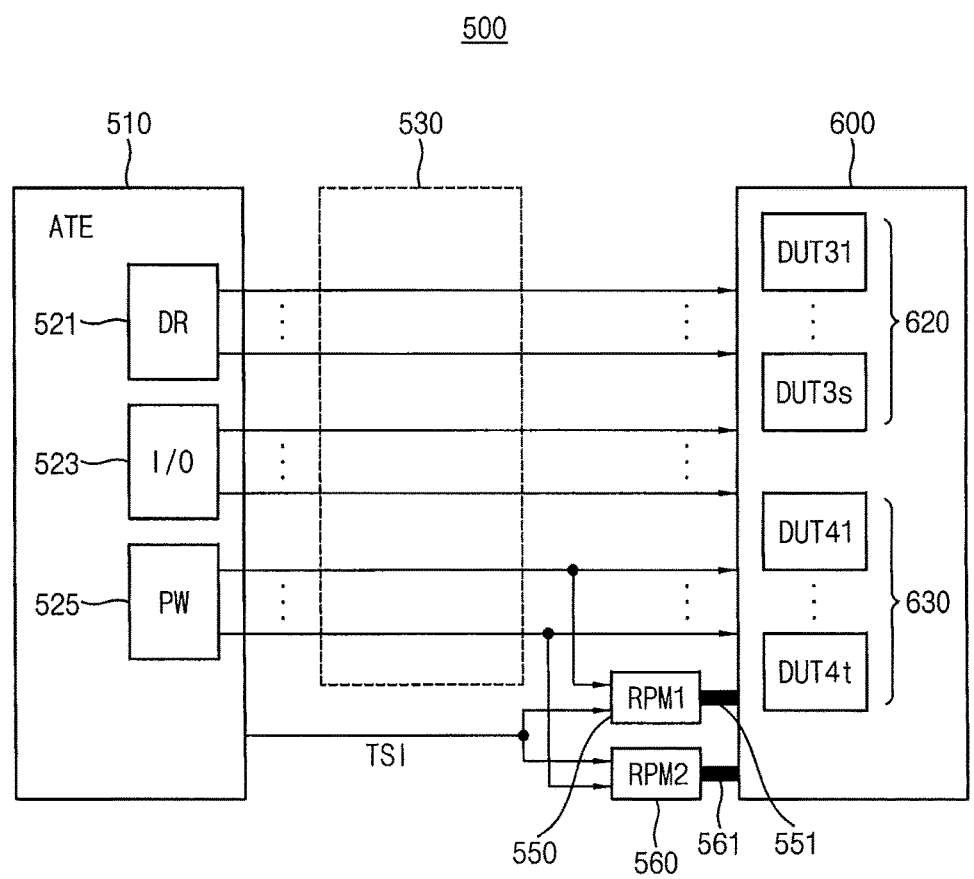
FIG. 16 is a block diagram illustrating another example of a test system according to exemplary embodiments.

FIG. 16 is a block diagram illustrating another exemplary embodiment of a test system in accordance with principles of inventive concepts.

Referring to FIG. 16, a test system 500 includes an ATE 510, a test board 600, a first RPM 550 and a second RPM 560. In some embodiments, the test system 500 may further include an interface board 530 interposed between the ATE 510 and the test board 600. The interface board 530 may route electrical interconnection between the ATE 510 and the test board 600. The interface board 600 may connect the ATE 510 and the test board 600 by a cable, for example.

A first group of DUTs (DUT31~DUT3s, where s is an integer greater than one) 620 and a second group of DUTs (DUT41~DUT4t, where t is an integer greater than one) 630 are mounted on the test board 600.

The ATE 510 generates test operation signals for testing the DUTs 620 and 630. The DUTs 620 and 630 receive the test operation signals and operate based on the test operation signals.

The ATE 510 may include driver channels 521 for transferring the generated test operation signals, input/output (I/O) channels 523 and power channels 525. In some embodiments, the driver channels 521 provide command signals, address signals and a clock signal. In some embodiments, the I/O channels 523 provide test pattern signals to the DUTs 620 and 630 respectively. In some embodiments, the power channels 525 provide a power resource such as voltage or current to the DUTs 620 and 630.

The first RPM 550 may be disposed proximately to the test board 600 and may be connected to the test board 600 through a first pogo pin 551. The second RPM 560 may be disposed proximately to the test board 600 and may be connected to the test board 600 through a second pogo pin 561. The ATE 510 may provide a test sequence information signal TSI to the first and second RPMs 550 and 560.

In exemplary embodiments, each of the first and second RPMs 550 and 560 may employ an RPM 300 in accordance with principles of inventive concepts such as that of FIG. 6. Therefore, each of the first and second RPMs 550 and 560 may include a charging circuit, a rechargeable battery, a DC-to-DC converter, an LDO voltage regulator, a controller and a switching circuit.

The first RPM 550 may store surplus power, or charge a surplus power resource, corresponding to an unconsumed portion of a power resource that is provided to first sub DUTs of the first group of DUTs 620. The first RPM 550 may provide charged power resource to the second group of DUTs 630 different from the first group of DUTs 620. Because, in this exemplary embodiment, the first RPM 620 provides the charged power resource to the second group of DUTs 630, the number of the DUTs that are simultaneously tested may be increased.

The second RPM 560 may store surplus power, or charge a surplus power resource, corresponding to a portion of unconsumed power resource that is provided to second sub DUTs of the first group of DUTs 620. The second RPM 560 may provide charged power resource to the first group of DUTs 620 and the second group of DUTs 630 according to a test item. Because, in accordance with principles of inventive concepts, the second RPM 630 provides the charged power resource to the first group of DUTs 620 and the second group of DUTs 630, power integrity may be enhanced. That is, the ability of the system to supply sufficient power for testing, while employing a relatively low-powered, that is, off-peak, power source in the ATE 510, is assured.

Figure 17:
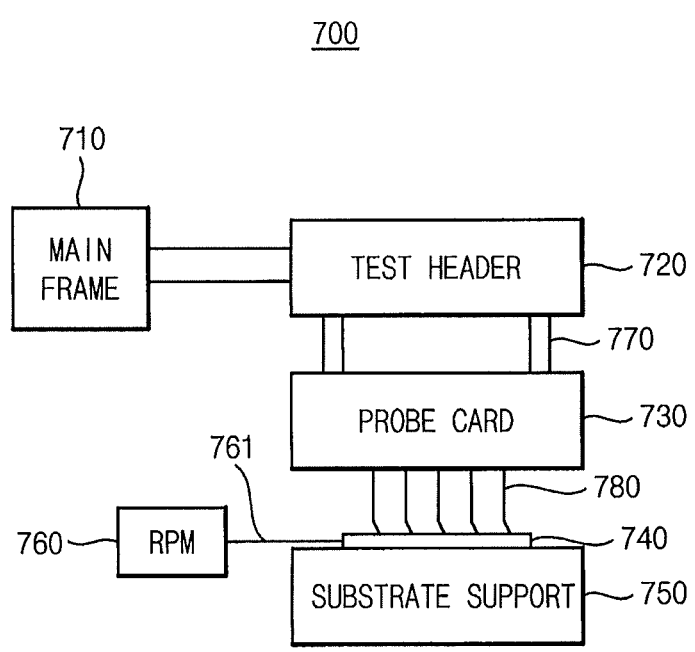
FIG. 17 is a block diagram illustrating a test system according to exemplary embodiments.

FIG. 17 is a block diagram illustrating an exemplary embodiment of a test system in accordance with principles of inventive concepts.

Referring to FIG. 17, a test system 700 includes a test main frame 710, a test header 720, a probe card 730, a wafer 740, a RPM 760 and a substrate support 750. The wafer 740 may include a plurality of semiconductor devices that are to be tested.

The test main frame 710 may generate a test signal, and may receive test result signals generated by the semiconductor devices formed in the wafer 740. In some exemplary embodiments, the test header 720 may move up and down such that the probe card 730 may be easily attached to the test header 720 and the wafer 740 may be easily mounted on the substrate support 750. In other exemplary embodiments, the substrate support 750 may move up and down while the test header 720 is fixed. In still other exemplary embodiments, both of the test header 720 and the substrate support 750 may together move up and down. The test main frame 710, the test header 720 and the substrate support 750 may form an ATE.

The probe card 730 may include a connector 770 and probe needles 780. The connector 770 may connect the test header 720 to the probe card 730, and the probe needles 780 may connect the probe card 730 to pads of the semiconductor devices. In exemplary embodiments, probe card 730 transmits test result signals from the probe needle 780 to the connector 770. The RPM 760 may be connected to the test board 740 through a pogo pin 761. As previously described, and RPM in accordance with principles of inventive concepts, such as RPM 760 may store power, or charge a surplus power resource, corresponding to an unconsumed portion of a power resource, which is not consumed by DUTs on the test board 740, when the power resource is provided to the DUTs on the test board 740 from the test header 720. The RPM 760 may provide the stored power, or charged power resource, to the DUTs on the test board 740.

The present disclosure may be applied to test systems that provide power resource to DUTs.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of inventive concepts as defined in the claims.

What is claimed is:

1. A test system comprising:
   automated test equipment (ATE) configured to provide test operation signals;
   a test board on which a plurality of devices under test (DUT)s are mounted, wherein the DUTs return output test result signals to the ATE in response to a test pattern signal of the test operation signals, the ATE providing a power resource to a first group of DUTs; and
   at least one rechargeable power module (RPM) configured to charge surplus power resource corresponding to a portion of the power resource not consumed by the first group of DUTs and configured to provide the charged surplus power resource to a second group of DUTs, the ATE providing the power resource to the first group of DUTs and the portion of the power resource being not consumed by the first group of DUTs.

2. The test system of claim 1, wherein the at least one RPM is disposed proximately to the test board and the at least one RPM is connected to the test board through a pogo pin.

3. The test system of claim 1, wherein the at least one RPM comprises:
   a rechargeable energy storage device;
   a charging circuit configured to provide the rechargeable energy storage device with a charging current from the power resource;
   a direct current (DC) to DC converter configured to stabilize a first voltage from the rechargeable energy storage device to output a second voltage;
   a low drop-out (LDO) voltage regulator configured to regulate the second voltage to provide a regulated voltage to a second group of DUTs; and
   a controller configured to control the charging circuit and the LDO regulator based on a test sequence information signal and a state of charge of the rechargeable energy storage device.

4. The test system of claim 3, wherein the ATE provides the test sequence information signal to the at least one RPM, the sequence information signal associated with a test sequence on the DUTs.

5. The test system of claim 1, wherein the ATE performs test on the DUTs according to a test sequence based on power resource consumption of the DUTs.

6. The test system of claim 5, wherein the test sequence includes a DC test, a function test and an alternating current (AC) test which are performed on the DUTs.

7. The test system of claim 1, wherein the ATE comprises a programmable power supply configured to provide the power resource to each of the DUTs, and the power resource includes a plurality of power supply voltages which are provided to a plurality of power pins of each DUT.

* * * * *